United States Patent [19]

Shafer et al.

[11] Patent Number: 5,477,158

[45] Date of Patent: Dec. 19, 1995

[54] COMPACT NONCONTACT EXCESS CARRIER LIFETIME CHARACTERIZATION APPARATUS

[75] Inventors: Thomas A. Shafer, Palmer; James H. McCurdy, Arlington; Thomas R. Schimert, Ovilla; Austin J. Brouns, Dallas, all of Tex.

[73] Assignee: Loral Vought Systems Corporation, Grand Prairie, Tex.

[21] Appl. No.: 130,908

[22] Filed: Oct. 4, 1993

[51] Int. Cl.$^6$ ............................ G01R 31/26; G01R 27/06
[52] U.S. Cl. ............................................. 324/753; 324/642
[58] Field of Search ................................ 324/642, 158 D, 324/158 R, 753

[56] References Cited

U.S. PATENT DOCUMENTS

| | | | |
|---|---|---|---|
| 3,939,415 | 2/1976 | Terasawa | 324/642 |
| 4,949,034 | 8/1990 | Imura | 324/158 R |
| 5,081,414 | 1/1992 | Kusama et al. | 324/642 |
| 5,196,786 | 3/1993 | Usami et al. | 324/158 D |

OTHER PUBLICATIONS

Photoconductivity Lifetime Measurements on HgCdTe Using A Contactless Microwave Technique M. C. Chen, 15 Jul. 1988, J. Appl. Phys., pp. 945–947.
Non-Contact Lifetime Screening Technique for HgCdTe Using Transient Millimetre–Wave Reflectance.
A. J. Brouns, T. R. Schimert, P. Mitra, F. C. Case, S. L. Barnes and Y. L. Tyan, Semicond. Sci. Technol. 8, 1993, pp. 928–935.
Properties of HgCdTe Layers Grown by Isothermal Vapour Phase Epitaxy at High Pressure, Semicond. Sci. Technol. 8 (1993) S205–S210.
The Study of Charge Carrier Kinetics in Semiconductors by Microwave Conductivity Measurements, M. Kunst and G. Beck.
J. Appl. Phys. 60 (10), 15 Nov. 1986 ©1986 American Institute of Physics, pp. 3558–3566.
Non–Destructive Characterization of HgCdTe Using Photo–Induced Microwave Reflection E. J. Spada, V. R. Rao, I. Bhat, J. M. Borrego, Feb. 1993.
Noncontact Lifetime Characterization Technique for LWIR HgCdTe Using Transient Millimeter–wave Reflectance, T. R. Schimert, J. Tyan, S. L. Barnes, V. E. Kenner and A. J. Brouns, Reprinted from Growth and Characterization of Materials for Infrared Detectors and Nonlinear Optical Switches 2–3 Apr. 1991, vol. 1484, SPIE–The International Society for Optical Engineering.

Primary Examiner—Kenneth A. Wieder
Assistant Examiner—Barry C. Bowser
Attorney, Agent, or Firm—Richards, Medlock & Andrews

[57] ABSTRACT

An apparatus (10) is provided for measuring the excess carrier lifetime in a semiconductor material, such as an HgCdTe wafer (MCT). The apparatus includes a computer controller (56) which automates the functions of the apparatus, including the operation of the shutter (28) to control the time the testing samples are exposed to the excitation energy from a laser (14), the laser energy intensity on the sample, the position of the wafer controlled by the computer controller operating a motorized sample positioner (39) and maintaining the temperature of the sample. Multiple samples are taken by the apparatus which are averaged and analyzed to result in a characterization of the carrier lifetime.

21 Claims, 5 Drawing Sheets

COMPACT NONCONTACT EXCESS CARRIER LIFETIME CHARACTERIZATION APPARATUS

TECHNICAL FIELD OF THE INVENTION

This invention relates to an apparatus for measuring the excess carrier lifetime in a semiconductor, specifically HgCdTe wafers.

BACKGROUND OF THE INVENTION

Measurement of the excess carrier lifetime is extremely important in characterizing and prescreening semiconductor materials. In the past, this measurement was often done by a contact technique, attaching electrodes directly to the semiconductor material being tested. A much better technique has more recently been used with noncontact lifetime characterization apparatus.

The current noncontact characterization apparatus in use are very large and complex devices. It takes a skilled operator to operate them correctly and they are slow and cumbersome in operation. A need therefore exists for an improved apparatus for measuring excess carrier lifetime characteristics which overcome the complexity and slowness of the prior designs.

SUMMARY OF THE INVENTION

In accordance with one aspect of the present invention, an apparatus is provided for measurement of excess carrier lifetime of a semiconductor material. The apparatus includes a first source of energy to excite the excess carriers in the semiconductor material. A second source of energy is used to measure the conductance of the semiconductor material. A computer controller is provided which functions to automatically expose the semiconductor material to the first source of energy to cause a predetermined quantity of energy to be transferred to the semiconductor. The computer controller further functions to monitor the change in conductance of the semiconductor material, analyze the change, and calculate the excess carrier lifetime of the semiconductor material.

BRIEF DESCRIPTION OF THE DRAWINGS

For a more complete understanding of the present invention and for further advantages thereof, reference is now made to the following description, taken in conjunction with the accompanying drawings, in which.

DETAILED DESCRIPTION

Figure 1:
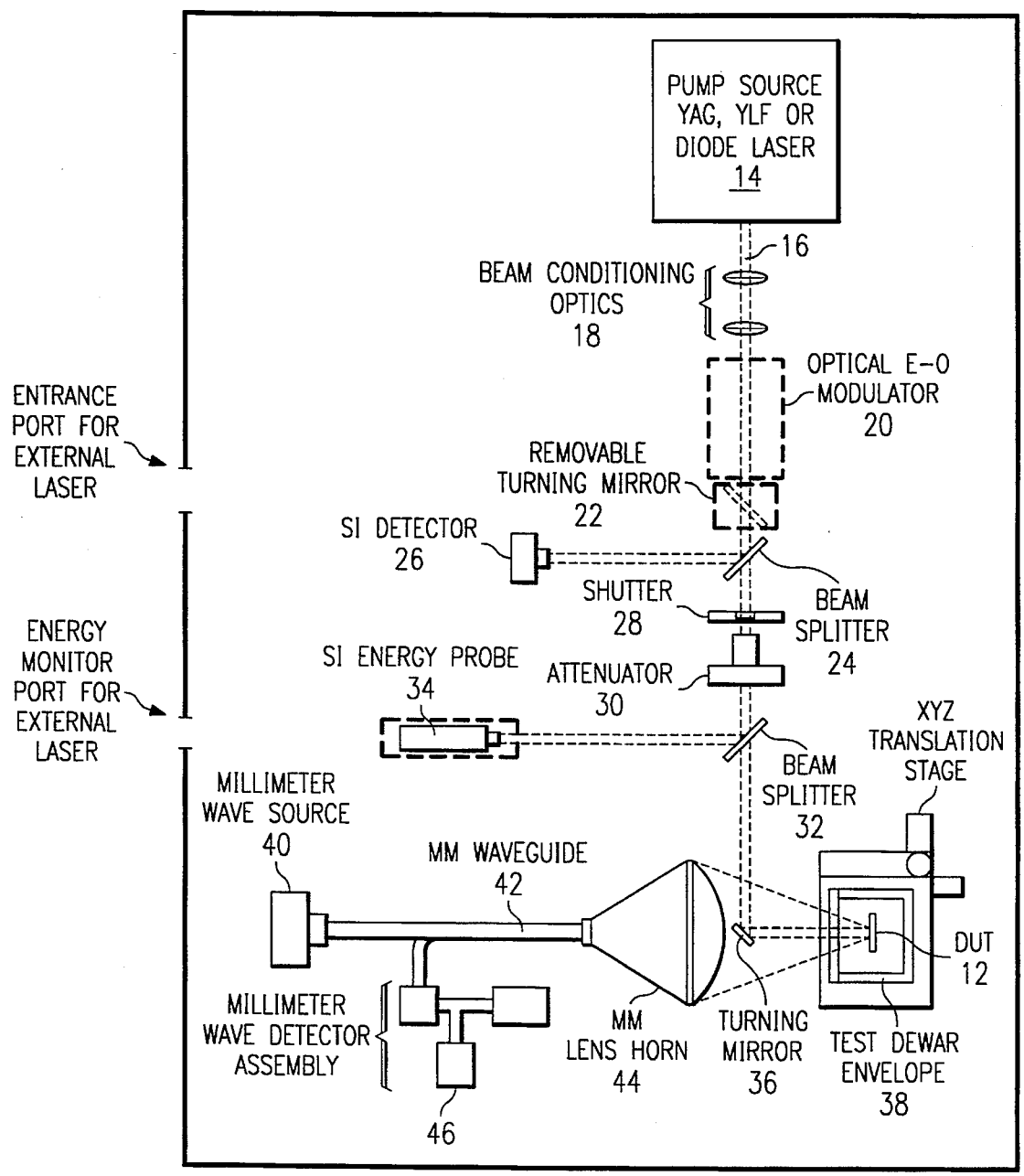
FIG. 1 is a schematic view of an apparatus forming the first embodiment of the present invention.
Figure 2:
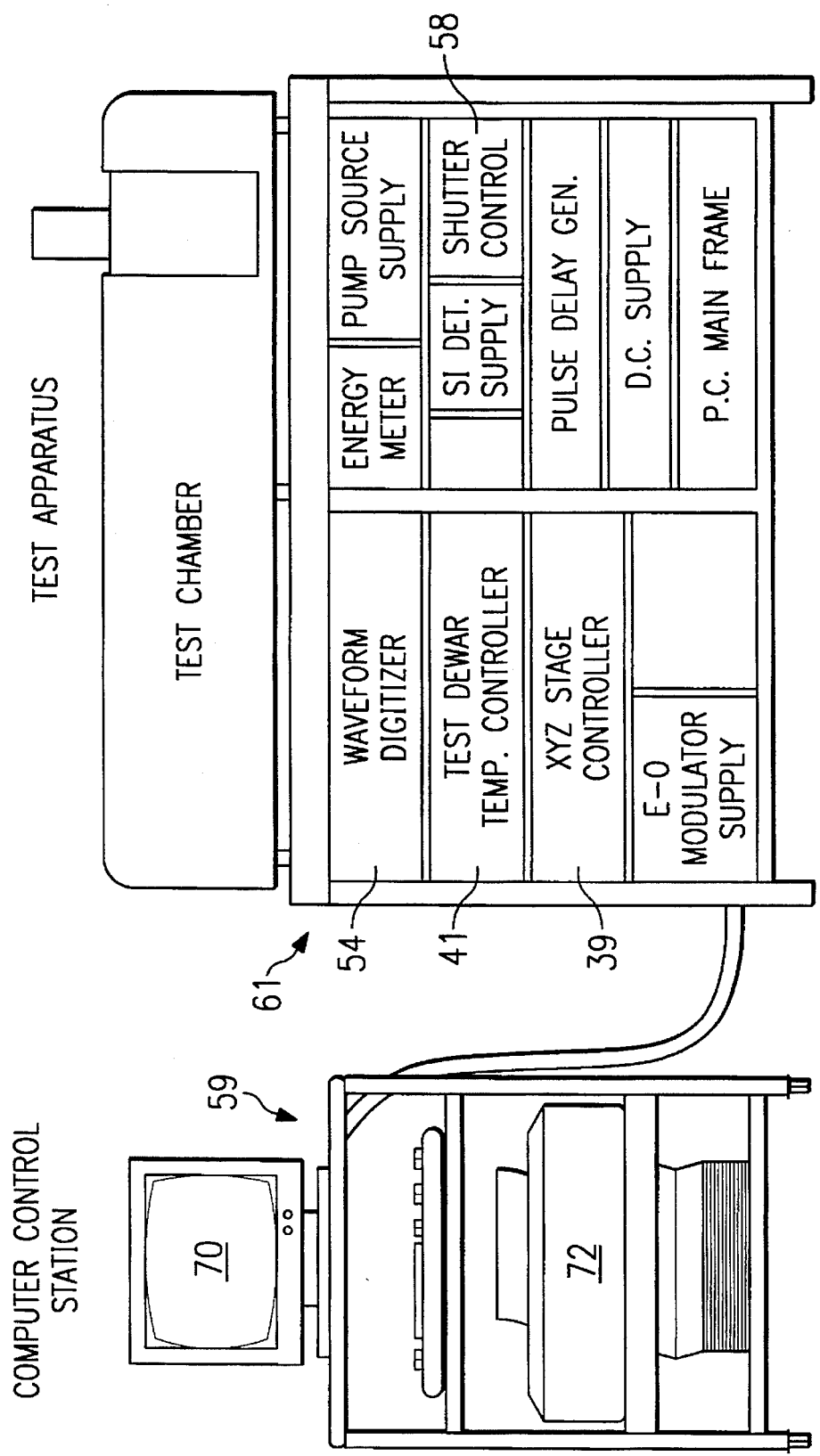
FIG. 2 is a side view of the apparatus.

With reference now to the accompanying figures, wherein like reference numerals designate like corresponding parts throughout the several views, there is shown in FIGS. 1 and 2 an apparatus forming a first embodiment of the present invention for measurement of the excess carrier lifetime of a semiconductor material 12. The material 12 being tested is commonly a HgCdTe (MCT) wafer and will be referred to as MCT sample 12. The apparatus is intended to measure lifetimes from less than 10 nanoseconds such as found in high doped (greater than $10^{16}$ electrons per cubic centimeter) p-type material to greater than one microsecond for low doped (less than $10^{15}$ electrons per cubic centimeter) n-type material.

A laser 14 forms a pump source to energize the excess carriers in the MCT sample 12. The laser 14 is preferably a YAG, YLF or diode laser. The beam 16 from the laser passes through beam conditioning optics 18 and to an optical E-O (electro-optic) modulator 20. The modulator 20 controls the duration of time that the MCT sample 12 is exposed to the beam 16. From the modulator 20, the beam 16 passes through a removable turning mirror 22 and to a beam splitter 24. The beam splitter directs part of the beam to a Si (silicon) detector 26 which monitors the Temporal Profile of the beam. The remainder of the beam passes through a shutter 28, an attenuator 30 and to a second beam splitter 32. The beam splitter 32 directs a portion of the beam to a Si (silicon) energy probe 34. The remainder of the beam passes to a turning mirror 36 and is directed to the semiconductor material sample 12 positioned within a test Dewar envelope 38 which maintains the sample at a predetermined temperature, typically between 80°–300° K. with liquid $N_2$, although colder temperatures can be achieved by using liquid helium. The test Dewar envelope 38 rests on a X, Y, Z axis or three axis motorized sample positioner 39. Positioner 39 allows the envelope 38, and sample 12, to be moved along three perpendicular axes to position the sample 12.

A millimeter (MM) wave source 40 generates energy of a certain wavelength, preferably a wavelength of 3.3 millimeters, having frequency of 90 megahertz. The energy from source 40 is directed along a millimeter wave guide 42 to a millimeter lens horn 44. The lens horn 44 focuses the energy from the source 40 onto a predetermined area of the semiconductor material 12.

Some of the energy directed to the semiconductor material 12 by source 40 will be reflected back to the lens horn 44. This reflected energy travels along the wave guide 42 and is collected by a millimeter (MM) wave detector assembly 46. As the energy from the laser 14 is absorbed by the semiconductor material 12, the excess carriers will be excited, which will change the conductance of the material 12. This conductance change results in a variation in the energy reflected back to the lens horn 44 which is then detected and analyzed to result in a measurement of the excess carrier lifetime as will be described hereinafter.

Figure 3:
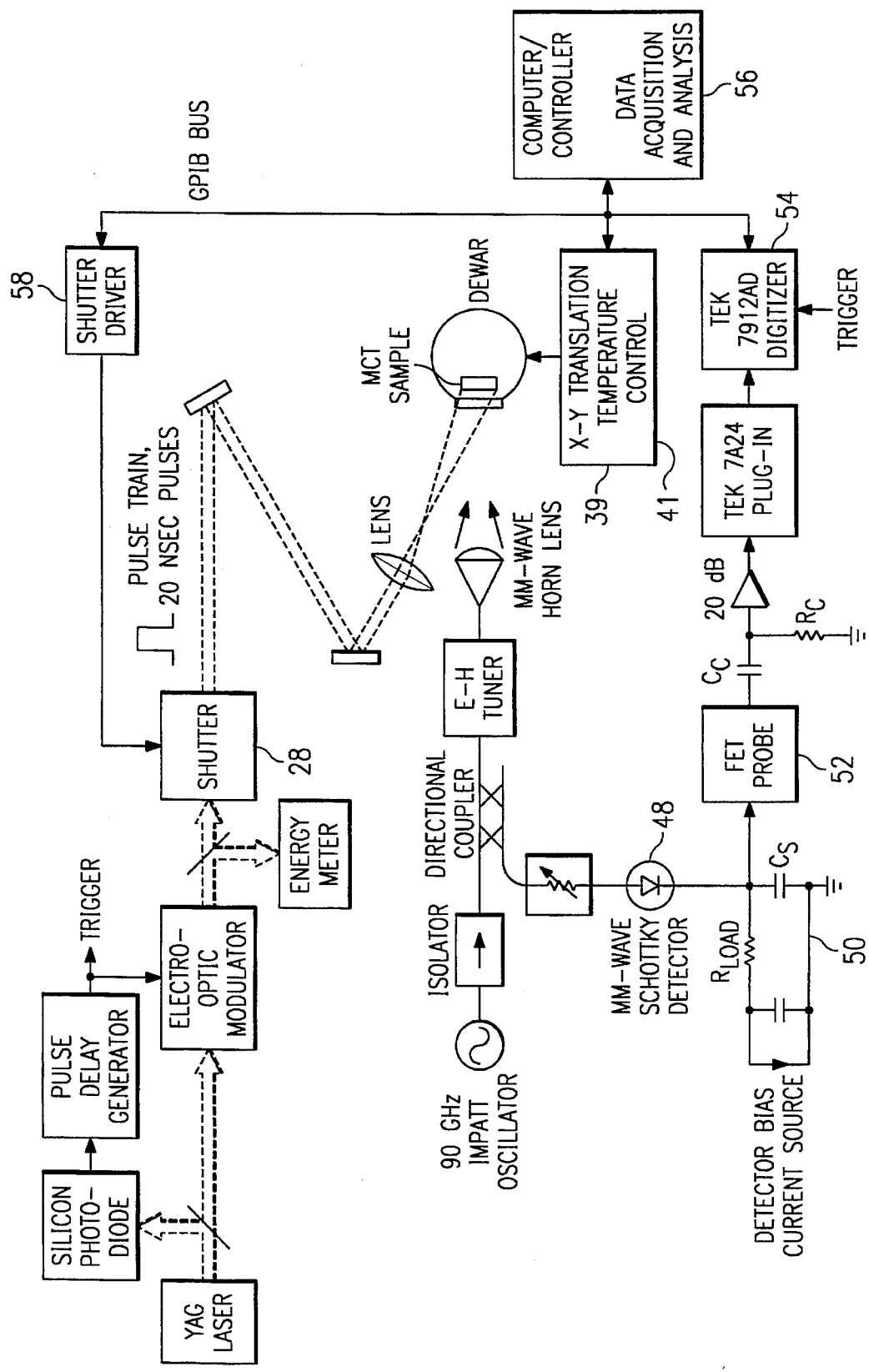
FIG. 3 is a schematic view of the apparatus illustrating the electronics used.
Figure 4:
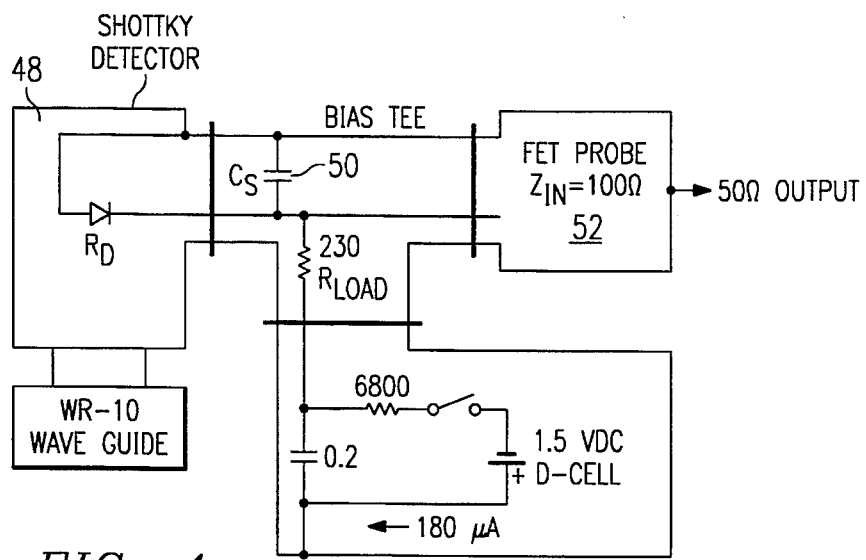
FIG. 4 is a schematic of the detector bias circuit.

FIGS. 2, 3 and 4 illustrate the processing of the data contained in the reflected millimeter wave energy. The millimeter wave energy is provided to a millimeter Schottky detector 48 and through a detector bias circuit 50 to an FET probe 52. The signal from the probe is provided to a digitizer 54 which digitizes the analog data measured by the FET probe 52. This digitized data is provided to a computer controller 56 which analyzes the data and computes the excess carrier lifetime of the semiconductor material. As can be seen, the computer controller also controls the operation of the shutter 28 through a shutter driver 58 and of the positioner 39 to position the MCT sample in the X, Y, and Z directions. The computer controller also controls the temperature of the MCT sample and the dewar envelope 38 through a temperature controller 41. The computer controller can also control the E-O modulator 20 and silicon energy probe 34. The computer controller also controls the laser current and pulse repetition rate of the laser 14 by input of the laser pulse energy from the silicon energy probe. The computer controller also controls when the MM wave source 40 and MM wave detector are turned on and their bias voltage.

The apparatus provides a compact, fully contained measurement instrument offering complete computer control. The compact apparatus could be contained in an installation with a footprint less than three foot by four foot with all measurement equipment housed in two stand alone racks 59 and 61 as seen in FIG. 2. The apparatus offers computer control of the entire test analysis procedure. Thus, specially trained operators would be unnecessary.

If desired, contact type excess carrier lifetime studies could be done as well. In addition, the test can be made all optical with a YAG laser used as a pump to excite the material and a $CO_2$ laser used as a probe to detect the change in transmittance of the MCT sample. The test can be photoconductive with a YAG or $CO_2$ laser used as a pump to excite the material and leads attached to the MCT sample to detect the change in resistance of the sample. The YAG laser would have a wavelength of about 1.06 micrometers, while the $CO_2$ laser would be tunable from about 9–11 micrometers wavelength. A short pulse GaAs diode laser can also be used.

In one apparatus constructed in accordance with the teachings of the present invention, laser 14 is a Quantronix 113 CW/Q switched laser having a wavelength of 1.06 micrometers. The positioner 39 is an Aerotech Unidex 11 Micropositioner. The millimeter wave source 40 is a Hughes 47136H Impatt diode source of 50 milliwatts. The Dewar envelope is a Janus model R/D liquid nitrogen Dewar, or if liquid helium is used, a model ST. The temperature controller is a Lakeshore cyrotronics model DRC/81C. The lens horn 44 is an Alpha 857W horn lens antenna. The Schottky assembly 46 is a Hughes 47326H Schottky diode detector. The computer controller is a personal computer based on a 486 microprocessor which is operated by a basic program which is listed beginning on page 12 of this application.

The FET probe 52 is a Tektronix P6201 FET probe which is connected to a Tektronix 7912AD digitizer having a Tektronix 7A24 plug in.

Figure 5:
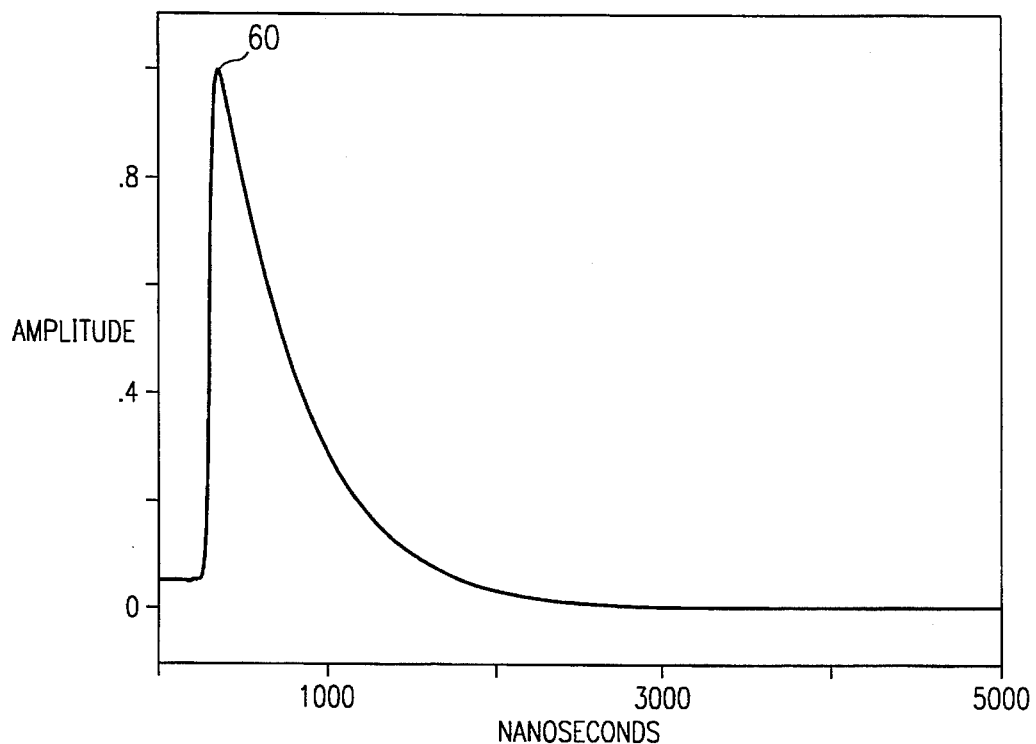
FIG. 5 is a representative data graph showing data collected and analyzed by the apparatus.
Figure 6:
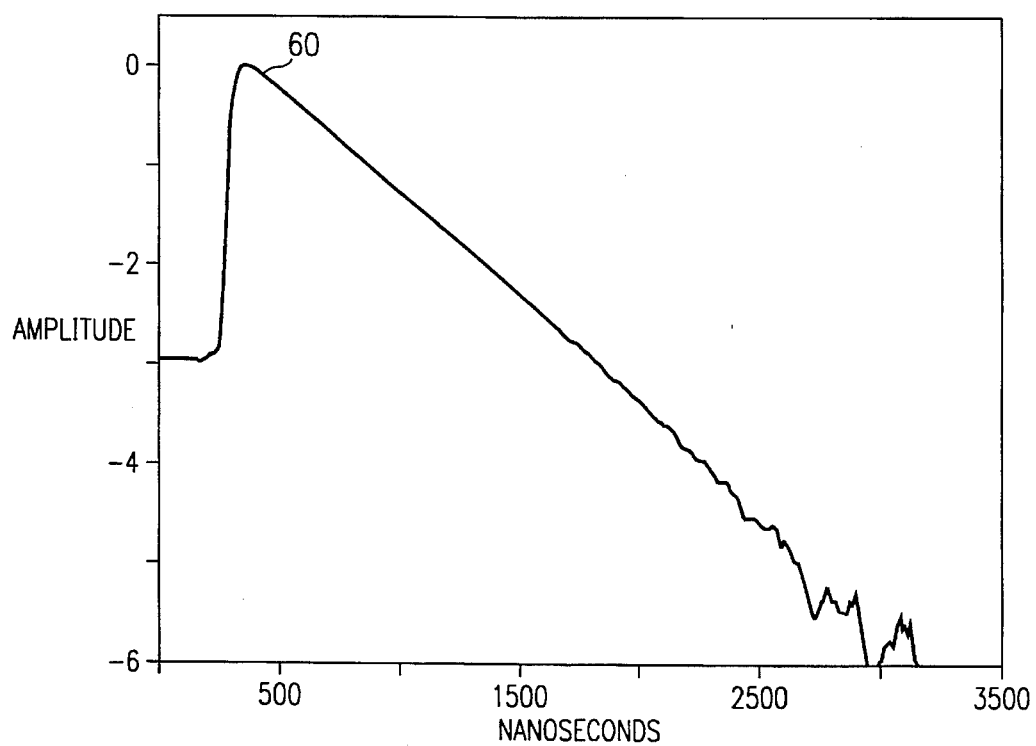
FIG. 6 is a representative log data graph showing the data.

With reference to FIGS. 5 and 6, the analysis of the data can be understood. FIG. 5 is a direct plot of the signal variation in the millimeter wave detector assembly 46 which shows the signal rises quickly to a peak value 60 while the MCT sample 12 is exposed to the energy of the laser 14, and decays thereafter as the excited excess carriers return to their normal state. The Y axis is signal voltage above a constant DC value representing the steady state reflected millimeter wave energy. The X axis is time, extending about 5000 nanoseconds. FIG. 6 illustrates the same data on a log plot versus time which, ideally, should illustrate a linear decay.

The controller 56 provides the capability to average multiple waveforms, such as shown in FIG. 5, correct for baseline noise, calculate the carrier lifetime, and tabulate, plot and store the results.

As proposed herein, the computer controller 56 would also provide control of the energy delivered to the test sample. The computer would control the position of an attenuator (set of optic filters or prisms) such as attenuator 30 in the laser beam. The laser energy on the test sample could be automatically adjusted by varying the rotational position of this optic.

Among the advantages of the computer controller 56 is control of the mechanical shutter 28 to decrease test cycle time and reduce chances for operator error.

Temporary storage of individual waveform files is made in the computer's RAM prior to averaging and analysis. This method increases test speed and conserves hard disk storage space since only the final average baseline corrected, normalized waveform is stored on the hard disk. The computer provides multiple waveform averaging, baseline noise correction, waveform polarity correction, normalization, decay function log calculation, and least squares linear regression fit of the decay function to calculate carrier lifetime. The computer also provides automatic storage of only the final normalized waveforms on the hard disk. An automatic display of the normalized waveform is provided on CRT monitor 70 immediately following the test which provides a quick feedback on how the setup is functioning. The program also provides an operator-selectable CRT display of log waveform and regression fit. Thus, the operator need not wait for a printed curve from printer 72 to review the results and the data is available for inspection immediately following each test.

When using a YAG laser 14, the duration of the light incident on the sample is expected to be in the range of about 2–40 nanoseconds. When using a $CO_2$ laser 14, the duration would be in the range of 10 nanoseconds to 10 milliseconds.

Use of the sample positioner 39 will permit the computer controller to inspect multiple spots on the MCT sample 12. For example, a center sample can be taken, followed by samples from a spot one millimeter above the center location and one millimeter below the center location. Also, a sample one millimeter to the left of the center position and one millimeter to the right of the center position can be taken.

Figure 7:
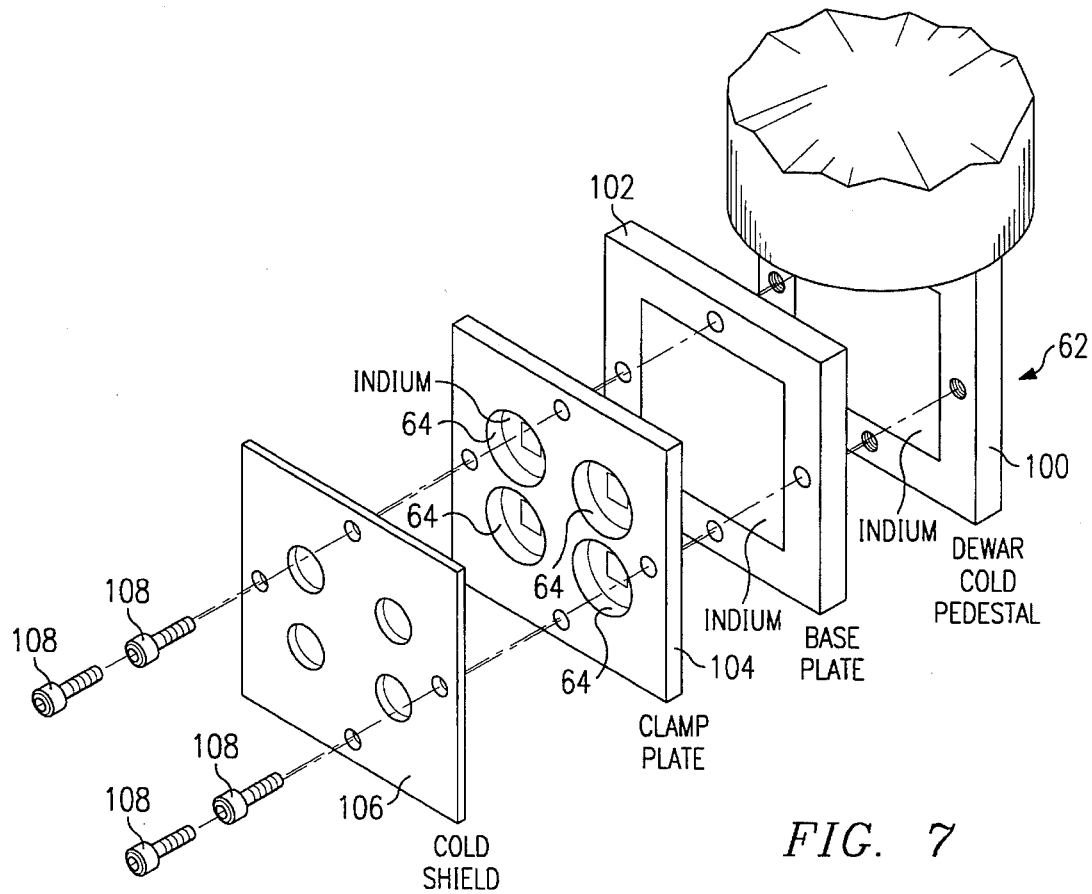
FIG. 7 is an exploded view of a four sample holder.

As seen in FIG. 7, a multiple sample container 62 can be mounted in the Dewar envelope which has four apertures 64 therein, each aperture receiving a particular MCT sample for measurement. Thus, four different samples can be examined without disturbing the setup of the Dewar envelope. The container 62 includes a Dewar cold pedestal 100, a base plate 102, a clamp plate 104 and a cold shield 106, all held together by screws 108. The cold pedestal 100, base plate 102 and clamp plate 104 are preferably made of Copper.

In samples taken with an apparatus constructed in accordance with the teachings of the present invention, the spot size of the laser beam 16 on the sample beam tested was typically 4 millimeters in diameter. Irradiance was maintained in a range from 1 to 400 watts per square centimeter for the duration of the incidence, typically 10 nanoseconds. Sixty-four waveforms were averaged by the digitizer 54, having been taken over a period of approximately six seconds with a sample rate of about ten hertz.

The present apparatus can be used to determine lifetime characteristics for both short lifetime, high doped P-type MCT material and long lifetime, low doped N-type MCT material. The materials can be probed with both front side and back size (i.e., through the substrate) illumination.

The 7912AD digitizer digitizes up to ten waveforms per second at up to two gigasamples per second. The data acquisition sequence is controlled by the computer controller 56 over a GPIB (General Purpose Interface Bus, IEEE Standard 488). Digitization of 512 points in each waveform is initiated by a trigger derived from the laser output. A cumulative average of sixty-four waveforms is taken with the shutter open, from which is subtracted the cumulative average of sixty-four waveforms with the shutter closed. This procedure serves to remove systematic DC offset and EMI coherent with the laser pulse frequency. The cycle is repeated several times with data being transferred from digitizer to computer controller memory at the end of each cycle for digital cumulative averaging to reduce random noise.

Although the present invention has been described with respect to a specific preferred embodiment thereof, various changes and modifications may be suggested to one skilled in the art and it is intended that the present invention encompass such changes and modifications as fall within the scope of the appended claims.

```
1   CLEAR     ,58400!       '= BASICA workspace - (size(bib728.m) +size(bib.m))
2   IBINIT1 = 58400!        'same
3   IBINIT2 = IBINIT1 +3    'Lines 1 through 6 MUST be included in your program
4   BLOAD "bib.m",IBINIT1
5   CALL IBINIT1(IBFIND,IBTRG,IBCLR,IBPCT,IBSIC,IBLOC,IBPPC,IBBNA,IBONL,IBRSC,IBS
RE,IBRSV,IBPAD,IBSAD,IBIST,IBDMA,IBEOS,IBTMO,IBEOT,IBRDF,IBWRTF,IBTRAP)
6   CALL IBINIT2(IBGTS,IBCAC,IBWAIT,IBPOKE,IBWRT,IBWRTA,IBCMD,IBCMDA,IBRD,IBRDA,I
BSTOP,IBRPP,IBRSP,IBDIAG,IBXTRC,IBRDI,IBWRTI,IBRDIA,IBWRTIA,IBSTA%,IBERR%,IBCNT%
)
7   INIT = IBINIT1+ 1200    '= IBINIT1 + size(bib.m)
8   BLOAD "bib728.m",INIT
9   CALL INIT(ENBLK,DEBLK)
10  '-----------------------------------------------------------------
11  ' for compiled version, remark lines 1-9 and
12  ' remove remark (') from the following line
14  'COMMON IBSTA%,IBERR%,IBCNT%
30  '-----------------------------------------------------------------
40  'DRC 81C TEMP CONTROLLER CONSTANTS
42  TCR$="M1"               'REMOTE
43  TCDS$="AS"              'DISPLAY SENSOR A
44  TCRD$=SPACE$(10)        'SPACE FOR READ
45  TCRS$="WS"              'SENSOR READING
46  TCRP$="WP"              'SETPOINT READING
47  TCHR$="R4"              'MAX FOR HEATERS
48  TD=1                    'SETPT TO SENSOR DIFF
50  'IEEE EQUIPMENT ADDRESSES
52  TCA$="DEV2"             'TEMP CONTROLLER ADDRESS
54  MCA$="DEV13"            'MOTION CONTROLLER ADDRESS
56  ARBBADD$="DEV9"         'SHUTTER CONTROLLER ADDRESS
60  'INITIALIZING OF EQUIPMENT
61  'TEMP CNTRL
62  CALL IBFIND(TCA$,TC%)        'FIND TEMP CNTRL
63  CALL IBWRT(TC%,TCR$)         'PUT IN REMOTE
64  CALL IBWRT(TC%,TCDS$)        'DISPLAY SENSOR A
66  'MOTION CONTROLLER
68  MI$="IAB*"              'CONSTANT FOR ABSOLUTE MODE
70  'SHUTTER CONTROLLER
71  CALL IBFIND(ARBBADD$,ARB%)   'FIND SHUTTER CNTRL
72  ARBSTR$="C0P1A0R0V0X"        'OPEN SHUTTER CONSTANT
73  CALL IBWRT(ARB%,ARBSTR$)     'OPEN SHUTTER
84  DATA "7912AD/HB",-1,-1,"dig sa,64;xyz sa;read sa","bin","VS1?","HS1?",0,4,128
,511,0,4,96,1
86  READ DIG$,SETUP%,SETDN%,PROMPT$,EC$,VSFP$,HSFP$,LENG%,MODE%,VS,VZ,HI,PRI%,SEC
%,EOI%
90  HELP%=-1
91  UERR%=240   ' USER DEFINDED ERROR
92  DIM WFM%(515),WTZ%(515,20)
93  DIM AVD(512),AVE(512),AVL(512)
100 KEY OFF:SCREEN 0:COLOR 9,0,0:CLS
102 PRINT "Transient Microwave Reflectance Multiple Wafer Lifetime Test"
110 PRINT "MIRADIG is a program designed specifically for running the LTV MIRA"
115 PRINT "Lifetime Characterization Set-up. It performs a variety of functions"
120 PRINT "including:"
122 PRINT "    A. Controlling the Tektronix 7912AD Digitizer"
124 PRINT "    B. Averaging, EMI correcting, and Normalizing the waveform"
126 PRINT "    C. Displaying the waveform linear and log plots"
128 PRINT "    D. Calculating and displaying a regression fit to the log plot"
130 PRINT "    E. Storing the resulting linear waveform to hard disk"
132 PRINT "    F. Compiling and storing test series data to a .LST file"
```

13

```
134 PRINT:PRINT "Special Notes-"
136 PRINT "1. The Digitizer is instructed to average 64 times for ea. waveform."
138 PRINT "2. The program expects to read in alternating Signal/EMI waveforms."
140 PRINT "3. A shutter is controlled via a IOTech model DAC 488/2."
142 PRINT "4. The program determines whether signal is Pos. or Neg. going."
143 PRINT "5. The Program is Designed to be Run on One Partition with"
144 PRINT "    Data being stored in the  C:\GURUDATA\  Directory "
149 LINE INPUT;FZ$
165 PRINT:PRINT
190 D$="C:\GURUDATA\"     'This is default drive variable
195 PRINT
200 INPUT "Enter Test Series LIST File Name(max. 8 characters, LL##.LST):",LSTNM
E$
210 IF ASC(LSTNME$)<58 AND ASC(LSTNME$)>47 THEN PRINT "Must not begin with numer
ic":GOTO 200
245 DA$=DATE$
250 CLS
251 PRINT "The TMR Multiple Wafer Lifetime Program Requires the Following Setup"
252 PRINT "1. Turn on Motion Controller and set to JOYSTICK"
253 PRINT "2. Move to each Wafer and Record each X and Y Locations"
254 PRINT "3. Return JOYSTICK to X=0 and Y=0 (<100 counts is close enough)"
255 PRINT "4. Turn Motion Conmtoller OFF and then ON"
256 LINE INPUT;FZ$
257 PRINT:PRINT
258 INPUT "Enter # of Test Points  ";TP
260 FOR TP%=1 TO TP STEP 1:CLS              'SAMPLE & LOCATION INPUTS
262 INPUT "Enter Sample Name:";SNT$(TP%)
264 PRINT "Enter Sample ";SNT$(TP%):INPUT " Test Description ";STDT$
266 PRINT:INPUT "Enter X Location ";X$(TP%)
268 INPUT "Enter Y Location ";Y$(TP%)
270 PRINT:PRINT "Sample ";SNT$(TP%);" is Located at X=";X$(TP%);" and Y=";Y$(TP%
);" for Quad#";TP%
272 INPUT "Are these correct ";R$
274 IF R$="N" OR R$="n" THEN GOTO 262
276 LISTNAME$(TP%)=LSTNME$+"L"+MID$(STR$(TP%),2)+".LST"
278 DLISTNAME$(TP%)=D$+LISTNAME$(TP%)
280 MX$(TP%)="IXF10000D"+X$(TP%)+"*"
282 MY$(TP%)="IYF10000D"+Y$(TP%)+"*"
284 OPEN"O",#2,DLISTNAME$(TP%)
286 WRITE#2,LISTNAME$(TP%),SNT$(TP%),DA$
288 WRITE#2,STDT$
289 CLOSE#2
290 NEXT TP%
291 CALL IBFIND(MCA$,MC%)         'FIND MOTION CNTRL
292 CALL IBWRT(MC%,MI$)           'SET TO ABSOLUTE LOCATION
293 FOR TP%=1 TO TP STEP 1                      'VERIFY SIGNAL TEST LOOP
294 COLOR 10,4,0:CLS
295 LOCATE 10,25:PRINT "LOCATION #";TP%;" Sample:";SNT$(TP%)
296 CALL IBWRT(MC%,MX$(TP%))
297 CALL IBWRT(MC%,MY$(TP%))
298 LINE INPUT;FZ$
299 NEXT TP%
300 COLOR 9,0,0:CLS
301 FOR TP%= 1 TO TP STEP 1
302 PRINT "Position #";TP%;"  Sample:";SNT$(TP%); "X=";X$(TP%);" and Y=";Y$(TP%)
304 NEXT TP%
305 PRINT:PRINT
306 INPUT " Locations Correct ";LC$
307 IF LC$="N" OR LC$="n" THEN GOTO 280
310 INPUT "Enter No. of Waveforms to be Averaged (18 Max) ";UZ%
```

```
320 INPUT "Enter Cal Factor for Energy Mon(nJ), Pulse Width(nm), Spot Size(cm2)
";CF,PW,SS
321 WCM=(20/PW)*50
322 ME=(WCM*PW*SS)/(.95*.95*CF)
324 CN=(.95*.95*CF)/(PW*SS)
326 PRINT "For ";CINT(WCM);"W/cm2 w/ PW=";PW;"ns, the Monitor Energy = ";ME;"nJ"
328 INPUT "Is this Correct (Y or N) ";R$
330 IF R$="N" OR R$="n" THEN GOTO 320
350 GOSUB 1000                 'INITIALIZE DIGITIZER
380 COLOR 9,0,0:CLS
400 ' BEGINING OF UNIFORMITY CALCULATOR
401 C$="0"
406 PRINT:PRINT:PRINT "Enter Filename for Uniformity Count (FC$=LL##)"
407 INPUT "Final Format is   FC$L##MW.TXT   ";FC$
408 IF ASC(FC$)<58 AND ASC(FC$)>47 THEN PRINT "Must not begin with numeric":GOTO 406
420 FOR L%=1 TO TP STEP 1
421 ZZ%=0
422 C%=VAL(C$)+1
423 C$=STR$(C%)
424 CALL IBWRT(TC%,TCRS$)
425 CALL IBRD(TC%,TCRD$)
426 TTT$=MID$(STR$(CINT(VAL(TCRD$))),2)
427 SN$(L%)=FC$+"L"+MID$(C$,2)+"MW.TXT"
428 DFILENAME$(L%)=D$+SN$(L%)
500 CALL IBWRT(MC%,MX$(L%))    'Moves to X-Axis Location
505 CALL IBWRT(MC%,MY$(L%))    'Moves to Y-Axis Location
506 COLOR 9,0,0:CLS
510 PRINT:PRINT:PRINT "Fine Tune Z-Axis and Laser Alignment for Sample:";SNT$(L%)
520 PRINT:PRINT "Enter  A  To Change NUMBER OF WAVEFORM AVERAGES"
522 PRINT:PRINT "Enter  B  To BYPASS TEST"
524 PRINT:PRINT "HIT ENTER To TEST"
525 LINE INPUT;FZ$
530 IF FZ$="B" OR FZ$="b" THEN GOTO 809
535 IF FZ$="A" OR FZ$="a" THEN INPUT "Enter number of Waveforms:";UZ%
560 ZZ%=ZZ%+1      '10 waveform averages loop
570 IF (ZZ% MOD 2)<>0 THEN GOSUB 3100 ELSE GOSUB 3200    'OPEN/CLOSE SHUTTER
600 GOSUB 5000     'ACQUIRE DATA
610 IF ZZ%<UZ% THEN GOTO 560
650 KEY OFF:SCREEN 0:COLOR 9,0,0:CLS:PRINT "TEST COMPLETE            file " SN$(L%) " stored"
651 ARBSTR$="C0P1A0R0V0X"
652 CALL IBWRT(ARB%,ARBSTR$)
654 INPUT "For preceeding test,Enter Mon Energy(nJ) ";EJ
656 PWT$=STR$(CINT(PW))
660 IT=(EJ*CN)
662 IF IT<1 THEN IRT$="."+STR$(CINT(10*IT)) ELSE IRT$=STR$(CINT(IT))
680 COLOR 4,2,0:CLS
682 LOCATE 10,25
684 PRINT "WAVEFORM ACQUIRED"
686 LOCATE 15,15
688 PRINT "DATA REDUCTION & GRAPHING NOW BEING PROCESSED"
690 LOCATE 20,15
692 PRINT "WAVEFILE ";SN$(L%);" IRRADIANCE WAS ";IRT$
700 GOSUB 7000          'DATA REDUCTION
750 GOTO 8000           'GRAPHING
800 KEY OFF:SCREEN 0:COLOR 9,0,0:CLS:PRINT "TEST COMPLETE            file " SN$(L%) " stored"
808 GOSUB 9000          'WRITE TO .LST FILE
```

```
809  NEXT L%
810  GOSUB 4000            'WRITE TO .TXT FILE
825  CLS
830  PRINT:PRINT "TEST SERIES COMPLETE          file " LISTNAME$ " stored"
835  INPUT "Print Test Series Data List(Y or N)";QZ$
837  IF QZ$<>"N" AND QZ$<>"n" THEN GOSUB 14000
840  INPUT "Begin a whole new series of tests (Y or N)";AT$
850  IF AT$<>"N" AND AT$<>"n" THEN GOTO 95
900  GOTO 9810
1000 ' select digitizer
1100 DEVICE$="TEKDEV1"
1110 HELP%=0:FUNC%=1:GOSUB 10000
1135 CALL IBPAD(BD%,PRI%) ' Change primary address
1150 CALL IBSAD(BD%,SEC%) ' Change secondary address
1155 CALL IBEOT(BD%,EOI%) 'set EOI
1990 RETURN
3000 'control shutter
3100 ' OPEN SHUTTER       GND LEVEL
3110 ARBSTR$="C0P1A0R0V0X"
3115 CALL IBWRT(ARB%,ARBSTR$)
3120 COLOR 26,4,0:CLS
3122 SOUND 37,20
3124 LOCATE 5,25
3128 PRINT "SHUTTER OPEN"
3130 COLOR 10,4,0
3134 LOCATE 10,25
3138 PRINT "ACQUIRING PULSE No. ";(ZZ%\2)+1
3140 LOCATE 15,25
3144 PRINT SN$(L%);ZZ%
3150 RETURN
3200 ' CLOSED SHUTTER     5V LEVEL
3210 ARBSTR$="C0P1A0R2V5X"
3215 CALL IBWRT(ARB%,ARBSTR$)
3220 COLOR 17,7,0:CLS
3222 SOUND 47,20
3224 LOCATE 5,25
3228 PRINT "SHUTTER CLOSED"
3230 COLOR 1,7,0
3234 LOCATE 10,25
3238 PRINT "ACQUIRING EMI No. ";(ZZ%\2)
3240 LOCATE 15,25
3244 PRINT SN$(L%);ZZ%
3250 RETURN
4000 'SAVE WAVEFORM STUFF
4010 CLS
4050 FOR L%=1 TO TP STEP 1
4100 PRINT SN$(L%);" Amplitude = ";VRT(L%);" Volts"
4110 'Write each File to Harddrive
4199 NEXT L%
4202 RX$="IXF10000D0*"
4204 RY$="IYF10000D0*"
4206 CALL IBWRT(MC%,RX$)
4208 CALL IBWRT(MC%,RY$)
4250 INPUT "Begin a new series of tests (Y or N) ";R$
4255 IF R$="Y" OR R$="y" THEN GOTO 15000
4300 RETURN
5000 ' Acquire waveform
5007 ' PRINT "acquiring waveform";ZZ%:PRINT
5008 NA$=DIG$
5010 WRT$=PROMPT$
```

```
5020 HELP%=0:FUNC%=3:GOSUB 10000
5030 IF EC$="bin" THEN HELP%=0:FUNC%=11:GOSUB 10000
5040 WRT$=VSFP$
5050 HELP%=0:FUNC%=3:GOSUB 10000
5060 FUNC%=4:GOSUB 10000:VU$=RD$:VU$(L%)=VU$
5062 MID$(VU$,1)="   "
5064 VRT=VAL(VU$)*10
5070 WRT$=HSFP$
5080 FUNC%=3:GOSUB 10000
5090 FUNC%=4:GOSUB 10000:HU$=RD$:HU$(L%)=HU$
5092 MID$(HU$,1)="   "
5094 HRZ=VAL(HU$)*1E+10
5990 RETURN
7000 'DATA REDUCTION
7100 AVP=0:AVQ=0      'ADD DATA FILES
7110 FOR I%=0 TO 511
7120 AVD(I%)=0
7130 FOR J%=1 TO UZ% STEP 2
7140 AVD(I%)=WTZ%(I%,J%)+AVD(I%)
7150 NEXT J%
7160 AVP=AVP+AVD(I%)
7170 NEXT I%
7180 AVP=AVP/512
7200 FOR I%=487 TO 511     'AV. LAST 25 PTS.
7210 AVQ=AVQ+AVD(I%)
7220 NEXT I%
7230 AVQ=AVQ/25
7300 FOR I%=0 TO 511     'ADD EMI FILES
7310 AVE(I%)=0
7320 FOR J%=2 TO UZ% STEP 2
7330 AVE(I%)=AVE(I%)+WTZ%(I%,J%)
7340 NEXT J%
7350 NEXT I%
7400 IF AVP<AVQ THEN GOTO 7450      'CHECK FOR +OR- WAVE
7410 FOR I%=0 TO 511
7420 AVD(I%)=AVD(I%)-AVE(I%)
7430 NEXT I%
7440 GOTO 7500
7450 FOR I%=0 TO 511
7460 AVD(I%)=AVE(I%)-AVD(I%)
7470 NEXT I%
7500 MIN=0:MAX=0      'FIND BASELINE
7510 FOR I%=487 TO 511
7520 MIN=MIN+AVD(I%)
7530 NEXT I%
7540 MIN=MIN/25
7585 OZ%=1:PZ%=3
7590 LSTRT(1)=-.2:LSTP(1)=-1      'DEF. LINEAR REGR. LOG LIMITS
7595 LSTRT(2)=-1:LSTP(2)=-3
7600 LSTRT(3)=-2:LSTP(3)=-4
7610 FOR I%=0 TO 511              'NORMALIZE AND STORE, CALC. LOG
7620 IF AVD(I%)>MAX THEN MAX=AVD(I%)
7630 NEXT I%
7635 VRT=(VRT*(MAX-MIN)/(32704*UZ%/2))/10
7640 VRT(L%)=VRT
7645 OPEN "O",#3,DFILENAME$(L%)
7650 FOR I%=0 TO 511
7655 IF PZ%>3 GOTO 7690
7660 AVD(I%)=(AVD(I%)-MIN)/(MAX-MIN)
7670 WRITE #3,AVD(I%)
```

```
7675 IF AVD(I%)<=0 THEN AVL(I%)=-100:GOTO 7690
7680 AVL(I%)=LOG(AVD(I%))
7690 FOR A%=OZ% TO PZ%
7695 IF AVL(I%)>LSTRT(A%) THEN TSTRT%(A%)=I%
7700 IF AVL(I%)>LSTP(A%) THEN TSTP%(A%)=I%
7702 'PRINT I%,AVL(I%),TSTRT%(A%),TSTP%(A%)
7705 NEXT A%
7720 NEXT I%
7725 IF PZ%>3 GOTO 7800
7730 VU=VAL(MID$(VU$(L%),6))*1000
7732 HU=VAL(MID$(HU$(L%),6))*1000000000#
7733 'PRINT VU$(L%),VU,HU$(L%),HU:INPUT "STOP";XXX$
7734 WRITE #3,SN%(L%),SNT$(L%),TTT$,IRT$
7735 WRITE #3,LE%,VU,HU,TI$(L%),DA$
7740 CLOSE#3
7800 FOR A%=OZ% TO PZ%    'LINEAR REGR. FIT
7805 DTIME%=TSTP%(A%)-TSTRT%(A%)+1
7810 SUMX=0:SUMY=0:SUMXX=0:SUMXY=0:SUMYY=0
7820 FOR I%=TSTRT%(A%) TO TSTP%(A%)
7830 SUMX=SUMX+(I%*HRZ/512)
7840 SUMY=SUMY+AVL(I%)
7850 SUMXX=SUMXX+(I%*HRZ/512)^2
7860 SUMXY=SUMXY+(I%*HRZ/512)*(AVL(I%))
7865 SUMYY=SUMYY+(AVL(I%))^2
7870 NEXT I%
7880 NUM=DTIME%*SUMXY-(SUMX*SUMY)
7890 DEN=DTIME%*SUMXX-(SUMX)^2
7900 SLOPE(A%)=NUM/DEN
7910 INTCPT(A%)=(1/DTIME%)*(SUMY-SLOPE(A%)*SUMX)
7920 'SDX=SQR(SUMXX-((SUMX)^2)/DTIME%/(DTIME%-1))
7930 'SDY=SQR((SUMYY-((SUMY)^2)/DTIME%)/(DTIME%-1))
7940 'COEF(A%)=SLOPE(A%)*SDX/SDY
7950 DRAWY(A%)=CINT(5+300*INTCPT(A%)/-6)
7955 ' PRINT INTCPT(A%) SLOPE(A%) HRZ
7960 DRAWX(A%)=100+CINT(((-6-INTCPT(A%))/SLOPE(A%))*(512/HRZ))
7970 ' PRINT DRAWY(A%) DRAWX(A%)
7980 NEXT A%
7985 IF PZ%>3 GOTO 8500
7990 RETURN
8000 KEY 1,"FIT1"
8010 ON KEY(1) GOSUB 8150:KEY(1) ON
8020 KEY 2,"FIT2"
8030 ON KEY(2) GOSUB 8155:KEY(2) ON
8040 KEY 3,"FIT3"
8050 ON KEY(3) GOSUB 8160:KEY(3) ON
8060 KEY 4,"NEWFIT"
8070 ON KEY(4) GOSUB 8800:KEY(4) ON
8080 KEY 5,"LINEAR"
8090 ON KEY(5) GOSUB 8200:KEY(5) ON
8095 KEY 6,"":KEY 7,"":KEY 9,"":KEY 10,""
8100 KEY 8,"EXIT"
8110 ON KEY(8) GOSUB 8120:KEY(8) ON:GOTO 8122
8120 V$="25":RETURN
8122 KEY ON
8125 GOSUB 8200
8130 V$=INKEY$
8140 IF V$<>"25" GOTO 8130
8145 GOTO 800
8150 B%=1:OZ%=1:PZ%=3:GOTO 8500
8155 B%=2:OZ%=1:PZ%=3:GOTO 8500
```

```
8160 B%=3:OZ%=1:PZ%=3:GOTO 8500
8200 ' GRAPH LINEAR
8210 GL%=0:CLS:SCREEN 9:COLOR 6,0,0
8220 COLOR 6:LINE(0,0)-(630,325),,B
8230 COLOR 7:LINE(100,5)-(100,310):LINE(95,305)-(612,305)
8240 FOR A%=1512 TO 6120 STEP 512
8250 D%=CINT(A%/10):LINE(D%,302)-(D%,308)
8260 NEXT A%
8262 LOCATE 23,12:COLOR 15
8264 PRINT"0.0" TAB(40) "TIME(nsec)" TAB(70) HRZ
8270 IF GL%=1 GOTO 8540
8275 COLOR 7
8280 FOR A%=5 TO 275 STEP 30
8290 LINE(97,A%)-(103,A%):NEXT A%
8300 COLOR 15:LOCATE 12,1:PRINT "REL-AMPL."
8310 LOCATE 1,8:PRINT "1.0"
8320 LOCATE 22,8:PRINT "0.0"
8330 COLOR 13
8350 FOR I%=0 TO 511
8360 GRAVD%=CINT(5+300-300*AVD(I%))
8370 PSET(I%+100,GRAVD%)
8380 NEXT I%
8390 COLOR 15:LOCATE 5,55:PRINT"Ampl.(V)=";VRT
8391 LOCATE 1,55:PRINT"FILE: ";SN$(L%)
8392 LOCATE 2,55:PRINT"SAMPLE: ";SNT$(L%)
8393 LOCATE 3,55:PRINT"TEMP(K): ";TTT$
8394 LOCATE 4,55:PRINT"IRRAD(W/cm2): ";IRT$
8395 RETURN
8500 ' GRAPH LOG
8505 IF GL%>1 GOTO 8632
8510 GL%=1:CLS:SCREEN 9
8530 GOTO 8220
8540 COLOR 7:FOR A%=5 TO 255 STEP 50
8550 LINE(97,A%)-(103,A%):NEXT A%
8560 COLOR 15:LOCATE 12,1:PRINT "LN-AMPL."
8570 LOCATE 1,8:PRINT "0.0"
8580 LOCATE 22,7:PRINT "-6.0"
8582 COLOR 15:LOCATE 1,35:PRINT"FILE: ";SN$(L%)
8583 LOCATE 2,35:PRINT"SAMPLE: ";SNT$(L%)
8584 LOCATE 3,35:PRINT"TEMP(K): ";TTT$
8585 LOCATE 4,35:PRINT"IRRAD(W/cm2): ";IRT$
8590 LOCATE 1,60:PRINT "Limit  Lifetm"
8595 IF PZ%>3 GOTO 8632
8600 COLOR 15:LOCATE 2,60:PRINT "-.2-1"
8602 LOCATE 3,60:PRINT "-1-3"
8604 LOCATE 4,60:PRINT "-2-4"
8608 FOR A%=OZ% TO PZ%
8610 LOCATE A%+1,66:PRINT USING"######";1/SLOPE(A%)
8620 'LOCATE A%+1,64:PRINT USING"####.#";COEF(A%)
8630 NEXT A%
8632 IF GL%<2 GOTO 8635
8634 COLOR 8:LINE(100,DRAWY(C%))-(DRAWX(C%),305)
8635 COLOR 13
8640 FOR I%=0 TO 511
8650 GRAVL%=CINT(5+300*(AVL(I%)/-6))
8660 PSET(I%+100,GRAVL%)
8670 NEXT I%
8675 IF PZ%>3 GOTO 8870
8680 COLOR 10:LINE(100,DRAWY(B%))-(DRAWX(B%),305)
8690 GL%=GL%+1:C%=B%
```

```
8700 RETURN
8800 ' NEW FIT
8802 FOR I%=7 TO 10
8804 LOCATE I%,60:PRINT "                   "
8806 NEXT I%
8808 IF PZ%>4 GOTO 8815
8810 PZ%=4
8815 OZ%=PZ%:COLOR 15
8820 LOCATE 7,60:PRINT"New Fit Limits"
8830 LOCATE 8,60:INPUT "LNSTART";LSTRT(PZ%)
8840 LOCATE 9,60:INPUT "LNSTOP";LSTP(PZ%)
8850 GL%=GL%+1
8860 GOTO 7650
8870 COLOR 15:LOCATE 10,60:PRINT LSTRT(PZ%)LSTP(PZ%)
8880 LOCATE 10,66:PRINT USING"#######";1/SLOPE(PZ%)
8890 'LOCATE 10,64:PRINT USING"####.#";COEF(PZ%)
8895 COLOR 10:LINE(100,DRAWY(PZ%))-(DRAWX(PZ%),305)
8900 C%=PZ%:PZ%=PZ%+1
8910 RETURN
9000 'WRITE TO .LST FILE
9001 OPEN"A",#2,DLISTNAME$(L%)
9002 IF PZ%=3 THEN PZ%=4
9005 FOR A%=1 TO PZ%-1
9010 WRITE #2,L%,TTT$,IRT$,PWT$,LSTRT(A%),LSTP(A%),1/SLOPE(A%),VRT(L%),SN$(L%)
9020 NEXT A%
9025 CLOSE#2
9030 RETURN
9810 FUNC%=16:GOSUB 10000
9815 ON ERROR GOTO 0 ' Turn off error handler
9820 PRINT "MIRADIG terminated."
9830 END
10000 '--------------------------------------------------------------------
10010 ' specialized subroutines for TEKDIG.BAS
10015 ' Copyright (C) 1985, Tektronix,Inc. All rights reserved.
10020 ' relocatable driver with selectable function codes
10030 ' specify function with FUNC%
10040 ' for help with subroutine parameters set HELP%=-1
10050 IF FUNC%=1 THEN 10230  '   1   select a device
10060 IF FUNC%=2 THEN 10280  '   2   serial poll a device
10070 IF FUNC%=3 THEN 10350  '   3   send a message to a device
10080 IF FUNC%=4 THEN 10410  '   4   get a response from a device
10130 IF FUNC%=9 THEN 10970  '   9   find reason for error
10150 IF FUNC%=11 THEN 11490 '  11   acquire waveform data (binary)
10200 IF FUNC%=16 THEN 13470 '  16   put bus into idle state
10210 INPUT "invalid function, [enter] to continue";A$
10220 RETURN
10230 'find a device
10250 CALL IBFIND (DEVICE$,BD%)
10260 GOSUB 10970 ' error check
10270 RETURN
10280 ' serial poll a device
10285 IF FUNC%<>3 AND FUNC%<>10 AND FUNC%<>11 THEN GOTO 10340
10290 SPR%=0
10300 CALL IBRSP (BD%,SPR%)
10305 IF SPR%=146 OR SPR%=210 THEN RETURN ' 7854 support
10315 IF SPR%=97 THEN PRINT "Device Command Error":GOTO 11170
10340 RETURN
10350 ' send message to device
10380 CALL IBWRT (BD%,WRT$)
10390 GOSUB 10970 ' error check
```

```
10400 RETURN
10410 'get message from a device
10430 RD$=SPACE$(20)
10440 CALL IBRD (BD%,RD$)
10445 'IF MID$(RD$,IBCNT%,1)=CHR$(13) THEN IBCNT%=IBCNT%-1:RD$=LEFT$(RD$,IBCNT%)
10450 GOSUB 10970 ' error check
10520 RETURN
10970 'check for GPIB error
10980 IF (IBSTA% AND &H8000)<>0 THEN GOTO 11020 ' GPIB error
10990 IF BD%<0 THEN PRINT "device not installed - use IBCONF then reboot":GOTO 11170
11000 IF (IBSTA% AND &H4000)<>0 THEN PRINT "timeout":GOTO 11170
11010 IF (IBSTA% AND &H100) <>0 THEN GOTO 10280 ' normal I/O
11020 PRINT "gpib error ";IBERR%
11030 IF IBERR%=0 THEN PRINT "DOS error (is device installed?)
11040 IF IBERR%=1 THEN PRINT "function requires GPIB-PC to be CIC
11050 IF IBERR%=2 THEN PRINT "no listener on write function; check cable, GPIB address"
11060 IF IBERR%=3 THEN PRINT "GPIB-PC not addressed correctly
11070 IF IBERR%=4 THEN PRINT "invalid argument to function call
11080 IF IBERR%=5 THEN PRINT "GPIB-PC not system controller as required
11090 IF IBERR%=6 THEN PRINT "I/O operation aborted
11100 IF IBERR%=7 THEN PRINT "non-existent GPIB-PC board
11110 IF IBERR%=10 THEN PRINT "I/O started before previous operation completed
11120 IF IBERR%=11 THEN PRINT "no capability for operation
11130 IF IBERR%=12 THEN PRINT "file system error
11140 IF IBERR%=14 THEN PRINT "command error during device call
11150 IF IBERR%=15 THEN PRINT "serial poll status byte lost
11160 IF IBERR%=16 THEN PRINT "SRQ stuck in on position
11170 IF HELP% THEN INPUT "[enter] to continue";A$
11180 ERROR UERR% ' this statment is here to force an error
11490 ' acquire waveform data (binary)
11530 TI$=TIME$
11540 TI$(L%)=TI$
11635 RD$=SPACE$(1)
11640 CALL IBRD (BD%,RD$)
11645 IF RD$=CHR$(255) THEN GOSUB 10970
11650 IF RD$<>"%" THEN GOTO 11635 ' read in up to percent sign
11700 ' determine block length
11710 RD$=SPACE$(2)
11720 CALL IBRD (BD%,RD$)
11730 GOSUB 10970
11740 COUNT%=ASC(RD$)*256+(ASC(RIGHT$(RD$,1)))-1
11750 CNT%=COUNT%+5
11760 CALL IBRDI (BD%,WFM%(0),CNT%)
11770 GOSUB 10970
11780 LGTH%=0
11790 CALL DEBLK(WFM%(0),WFM%(0),COUNT%,MODE%,LGTH%)
11800 GOSUB 10970
11810 LE%=LGTH%-1
11850 FOR I%=0 TO 511
11855 WTZ%(I%,ZZ%)=WFM%(I%)
11870 NEXT I%
11880 ' PRINT ZZ%,WTZ%(1,ZZ%),WTZ%(250,ZZ%),WTZ%(500,ZZ%)
11900 RETURN
13470 ' put bus into idle state
13480 BDNAME$="gpib0":V%=0
13490 CALL IBFIND (BDNAME$,BB%)
13500 GOSUB 10970   ' error check
13510 CALL IBSRE (BB%,V%)
```

```
13520 GOSUB 10970   ' error check
13530 RETURN
14000 'PRINT .LST FILE
14010 WIDTH"LPT1:",255
14020 OPEN"LPT1:" AS #1
14050 FOR L%=1 TO TP STEP 1
14080 OPEN"I",#3,DLISTNAME$(L%)
14090 INPUT#3,AL$,BL$,CL$
14100 INPUT #3,DL$
14120 LPRINT
14130 LPRINT TAB(1) "FILE#:"AL$ SPC(4) "SAMPLE#:"BL$ SPC(4) "TEST DATE:"CL$
14140 LPRINT:LPRINT TAB(1) "DESCRIPTION:"DL$
14150 X$=STRING$(80,95)
14160 PRINT #1,X$,CHR$(13),CHR$(10)
14170 LPRINT TAB(1)"Loc | Temp |   Irrad  PW  |   Limits     Lifetime   | Sig Ampl | Wavefile #"
14180      PRINT #1,"      | (K)  | (W/cm2)(ns) |   (ln)       (nsec)    | (Volts)  |"
14190 PRINT #1,CHR$(13)
14195 C=0
14196 TV$="0"
14200 IF EOF(3) THEN GOTO 14300
14205 IF C>50 THEN GOTO 14600
14210 INPUT #3,L,FL$,GL$,HL$,ML$,NL$,IL,JL,KL$
14215 IF TV$<>FL$ THEN GOSUB 14500
14217 TV$=FL$
14218 PRINT #1,CHR$(10),CHR$(13)
14220 LPRINT TAB(2):PRINT #1,USING"#";L;         'location
14230 LPRINT TAB(7):PRINT #1,USING"\ \";FL$;     'TEMP
14240 LPRINT TAB(14):PRINT #1,USING"\ \";GL$;    'IRRAD
14250 LPRINT TAB(22):PRINT #1,USING"\ \";HL$;    'PW
14252 LPRINT TAB(29):PRINT #1,USING"\ \";ML$;    'LN TOP LIMIT
14255 PRINT #1,USING"\ \";NL$;                   'LN LOW LIMIT
14260 LPRINT TAB(40):PRINT #1,USING"#####.#";IL; 'LIFETIME
14270 LPRINT TAB(53):PRINT #1,USING"#.###^^^^";JL; 'AMPLITUDE
14280 LPRINT TAB(66):PRINT #1,USING"\         \";KL$  'WAVEFILE
14285 C=C+1
14290 GOTO 14200
14300 CLOSE #3:PRINT #1,CHR$(12),CHR$(13):NEXT L%:RETURN
14500 PRINT #1,X$
14550 RETURN
14600 PRINT #1,CHR$(12),CHR$(13)
14610 GOTO 14120
15000 'CHANGE TEMP
15010 MN$="77":MX$="350"
15100 INPUT "Enter next Temperature  OR  R for repeat for same Temp ";STC$
15120 IF STC$="R" OR STC$="r" THEN GOTO 15560
15140 IF VAL(STC$)>VAL(MN$) AND VAL(STC$)<VAL(MX$) THEN GOTO 15200
15160 PRINT "Incorrect Entry"
15170 GOTO 15000
15200 'TEMP RAISE ROUTINE
15201 COLOR 4,2,0:CLS
15202 IF VAL(STC$)<VAL(TTT$) THEN PRINT "MUST HELP COOL DEWAR DOWN"
15204 TCSP$="S"+STC$
15210 CALL IBWRT(TC%,TCSP$)              'SET SETPOINT
15212 CALL IBWRT(TC%,TCHR$)              'HEATERS ON
15214 CALL IBWRT(TC%,TCRS$)              'READ SENSOR
15216 CALL IBRD(TC%,TCRD$)
15218 ST=VAL(TCRD$)
15220 FOR I=1 TO 500 STEP 1              'IEEE SLOWDOWN
```

```
15222 NEXT I
15224 CALL IBWRT(TC%,TCRP$)           'READ SETPOINT
15226 CALL IBRD(TC%,TCRD$)
15228 SP=VAL(TCRD$)
15230 FOR I=1 TO 500 STEP 1            'IEEE SLOWDOWN
15232 NEXT I
15234 CALL IBWRT(TC%,TCDS$)            'DISPLAY SENSOR
15236 D=SP-ST                          'DIFF OF SETPT TO SENSOR
15300 CLS:LOCATE 10,20
15302 PRINT "Temperature Stabilizing at ";SP;"K"
15304 LOCATE 15,20
15306 PRINT "Current Temperature is ";ST;"K"
15400 IF ABS(D)>TD THEN GOTO 15214
15500 'WAIT 3 MIN LOOP
15510 COLOR 1,7,0:CLS
15512 LOCATE 10,15
15514 PRINT "Waiting 3 min for Temp at "SP;"K to stabilize"
15520 OT$=TIME$
15522 OS=VAL(MID$(OT$,7,2))/100
15524 OM=VAL(MID$(OT$,4,2))
15526 OH=VAL(MID$(OT$,1,2))*100
15528 IF OM<57 THEN OM=OM+3 ELSE OM=((OM+3)-60)+100
15530 ST=OH+OM+OS
15540 NT$=TIME$
15542 NS=VAL(MID$(NT$,7,2))/100
15544 NM=VAL(MID$(NT$,4,2))
15546 NH=VAL(MID$(NT$,1,2))*100
15548 CT=NH+NM+NS
15550 IF CT<ST THEN GOTO 15540
15560 COLOR 9,0,0:CLS
15570 PRINT "Previous File Count was ";FC$
15580 GOTO 400
```

We claim:

1. An apparatus for measurement of the excess carrier lifetime of an HGCDTE semiconductor material to measure lifetimes from less than ten nanoseconds to greater than one microsecond, comprising:

a laser for generating a beam of energy;

an optical electro-optic modulator in the path of the beam;

a beam splitter for splitting the beam into a first portion and a second portion;

a silicon detector, the second portion of the beam incident thereon, to monitor the temporal profile of the beam;

a shutter in the path of the first portion of the beam;

an attenuator in the path of the first portion of the beam;

a positioner mounting the semiconductor material to expose a portion of the semiconductor material to the first portion of the beam, the positioner movable along a first direction parallel the beam and along second and third mutually perpendicular directions transverse the beam;

a millimeter wave source generating a second beam of energy, the second beam incident upon the portion of the semiconductor material;

a detector to detect energy of the second beam reflected from the semiconductor material back to the wave source;

a digitizer to digitize the analog signal data detected by the detector;

a digital computer to analyze the digitized data to compute the excess carrier lifetime of the semiconductor material and control the duration of the laser beam and electro-optic modulator in response to the data from the silicon detector, the digital computer further positioning the positioner.

2. The apparatus of claim 1 wherein the digital computer controls the laser to generate a series of pulses of energy incident on the semiconductor material, the data of excess carrier lifetime for each pulse being averaged over the series of pulses to calculate an average excess carrier lifetime.

3. The apparatus of claim 1 wherein the digital computer controls the positioner to move the semiconductor material to test the excess carrier lifetime of a second portion of the semiconductor material.

4. The apparatus of claim 1 wherein the positioner mounts a plurality of semiconductor materials, the digital computer controlling the positioner to move each of said semiconductor materials in sequence for exposure to measure the excess carrier lifetime thereof.

5. The apparatus of claim 1 further having a temperature controller to control the temperature of the semiconductor material, the digital computer controlling the temperature controller to control the temperature of the semiconductor material.

6. The apparatus of claim 1 further comprising a shutter driver, the shutter driver for operating the shutter, the digital computer controlling the shutter driver.

7. An apparatus for measurement of the excess carrier lifetime of a test wafer of semiconductor material, comprising:

a first source of energy generating a beam to excite the excess carriers in a semiconductor material;

a second source of energy generating a beam to measure the conductance of the semiconductor material;

a mechanism for adjustment of the beam size of the energy from the first source of energy and for adjustment of the spacial energy profile of the beam from the first source of energy;

a turning mirror, the turning mirror turning the energy beam from the first source of energy into a co-axial relation with the beam from the second source of energy; and a computer program to control the mechanism to control the beam size and spacial energy profile of the beam from the first source of energy at the test wafer.

8. The apparatus of claim 7 wherein the first energy source is a diode laser, the computer controlling the current to the diode laser to control the energy in the beam from the first source of energy.

9. The apparatus of claim 7 further comprising a millimeter wave lens horn focusing the energy from the second source of energy onto the test wafer, permitting the test wafer to be positioned at a distance from the second source of energy.

10. The apparatus of claim 7 further comprising a temperature controlled envelope maintaining the temperature of the test wafer at a temperature between a cryogenic temperature and room temperature, the computer controlling the envelope temperature.

11. The apparatus of claim 7 further comprising an electro-optical modulator, the computer controlling the electro-optical modulator to optimize the pulse duration of the beam of energy from the first source of energy depending on the characteristics of the wafer being tested.

12. An apparatus for measurement of the excess carrier lifetime of a semiconductor material to measure lifetimes from less than ten nanoseconds to greater than one microsecond, comprising:

a laser for generating a beam of light;

an optical electro-optic modulator in the path of the beam;

a beam splitter for splitting the beam into a first portion and a second portion;

a silicon detector, the second portion of the beam incident thereon, to monitor the temporal profile of the beam;

a shutter in the path of the first portion of the beam;

an attenuator in the path of the first portion of the beam;

a positioner mounting the semiconductor material to expose a portion of the semiconductor material to the first portion of the beam, the positioner movable along a first direction parallel the beam and along second and third mutually perpendicular directions transverse the beam;

a millimeter wave source generating a second beam of energy, the second beam incident upon the portion of the semiconductor material;

a detector to detect energy of the second beam reflected from the semiconductor material back to the wave source;

a digitizer to digitize the analog signal data detected by the detector; and a digital computer to analyze the digitized data to compute the excess carrier lifetime of the semiconductor material and control the duration of the laser beam and electro-optic modulator in response to the data from the silicon detector, the digital computer further positioning the positioner.

13. The apparatus of claim 12, wherein the digital computer controls the laser to generate a series of pulses of energy incident on the semiconductor material, the data of excess carrier lifetime for each pulse being averaged over the series of pulses to calculate an average excess carrier lifetime.

14. The apparatus of claim 12, wherein the digital computer controls the positioner to move the semiconductor material to test the excess carrier lifetime of a second portion of the semiconductor material.

15. The apparatus of claim 12, wherein the positioner mounts a plurality of semiconductor materials, the digital computer controlling the positioner to move each of said semiconductor materials in sequence for exposure to measure the excess carrier lifetime thereof.

16. The apparatus of claim 12, further having a temperature controller to control the temperature of the semiconductor material, the digital computer controlling the temperature controller to control the temperature of the semiconductor material.

17. The apparatus of claim 12, further comprising a shutter driver, the shutter driver for operating the shutter, the digital computer controlling the shutter driver.

18. An apparatus for measurement of the excess carrier lifetime of a test wafer of semiconductor material, comprising:

- a first source of energy generating a beam to excite the excess carders in a semiconductor material;
- a second source of energy generating a beam to measure the conductance of the semiconductor material;
- a mechanism for adjustment of the beam size of the energy from the first source of energy and for adjustment of the spacial energy profile of the beam from the first source of energy;
- a millimeter wave lens horn focusing the energy from the second source of energy onto the test wafer, permitting the test wafer to be positioned at a distance from the second source of energy; and
- a computer program to control the mechanism to control the beam size and spacial energy profile of the beam from the first source of energy at the test wafer.

19. The apparatus of claim 18, further comprising a temperature controlled envelope maintaining the temperature of the test wafer at a temperature between a cryogenic temperature and room temperature, the computer controlling the envelope temperature.

20. The apparatus claim 18, further having a turning mirror, the turning mirror turning the energy beam from the first source of energy into a co-axial relation with the beam from the second source of energy.

21. The apparatus of claim 18, further comprising an electro-optical modulator, the computer controlling the electro-optical modulator to optimize the pulse duration of the beam of energy from the first source of energy depending on the characteristics of the wafer being tested.

* * * * *

UNITED STATES PATENT AND TRADEMARK OFFICE
CERTIFICATE OF CORRECTION

PATENT NO. : 5,477,158
DATED : December 19, 1995
INVENTOR(S) : Thomas A. Shafer, et al.

It is certified that error appears in the above-indentified patent and that said Letters Patent is hereby corrected as shown below:

Col. 31, line 22, delete the word "carders" and insert the word --carriers--.

Signed and Sealed this

Fifteenth Day of October, 1996

Attest:

BRUCE LEHMAN

*Attesting Officer*    Commissioner of Patents and Trademarks